United States Patent [19]

Chruma et al.

[11] Patent Number: 4,732,866
[45] Date of Patent: Mar. 22, 1988

[54] METHOD FOR PRODUCING LOW NOISE, HIGH GRADE CONSTANT SEMICONDUCTOR JUNCTIONS

[75] Inventors: Jerry L. Chruma, Scottsdale; William E. Gandy, Jr., Phoenix; Tommie R. Huffman, Tempe; Syd R. Wilson, Phoenix, all of Ariz.

[73] Assignee: Motorola Inc., Schaumburg, Ill.

[21] Appl. No.: 588,628

[22] Filed: Mar. 12, 1984

[51] Int. Cl.$^4$ .................... H01L 21/425; H01L 29/90
[52] U.S. Cl. ...................................... 437/20; 437/141; 437/248; 357/13
[58] Field of Search ............... 148/DIG. 4, DIG. 174; 357/13; 437/20, 141

[56] References Cited

U.S. PATENT DOCUMENTS

| | | | |
|---|---|---|---|
| 3,515,956 | 6/1970 | Martin et al. | 148/1.5 X |
| 3,634,738 | 1/1972 | Leith et al. | 148/1.5 X |
| 3,638,300 | 2/1972 | Foxhall et al. | 29/589 |
| 3,856,578 | 12/1974 | Payne et al. | 148/1.5 |
| 4,030,117 | 6/1977 | Kling | 357/13 |
| 4,155,777 | 5/1979 | Dunkley et al. | 148/1.5 |
| 4,155,778 | 5/1979 | Antipov | 148/1.5 |
| 4,393,575 | 7/1983 | Dunkley et al. | 29/571 |

OTHER PUBLICATIONS

S. R. Wilson et al, "Annealing of Boron Implanted Devices", *Mat. Res. Soc. Symp.*, Jun. 1984, vol. 83.
S. R. Wilson et al, "Thermal Stability of Electrically Active Dopant in Annealed Silicon Films, *J. Appl. Phys.*, vol. 54(a), Sep. 1983.
Hodgson et al, "Rapid Thermal Annealing of Silicon Using a Ultra High Power Arc Lamp", *Mat. Res. Soc. Symp. Proc.*, vol. 13, 6/83.
Wilson et al, "Laser Processing of Ion Implanted Semiconductor Materials for Device Applications", *IEEE Trans. on Nuclear Science*, vol. NS-28, #2, 6/81.
White et al, "Supersaturated Substitutioned Alloys Formed by Ion Implantation and Pulsed Laser Annealing of Group III and Group V Dopants in Silicon", *J. Appl. Phys.*, vol. 51(i), 1/80.
Wilson, S. R. et al, "Characterization at Ion Implanted Silicon Annealed With a Graphite Radiation Source" in *IEEE Trans. Nucl. Sci.*, vol. NS-30, No. 2, Apr. 1983, pp. 1734–1737.
Wilson, S. R. et al, "Isothermal Annealing of Ion Implanted Silicon With a Graphite Radiation Source", in *Mat. Res. Soc. Symp. Proc. Vol.* 13, (1983), Elsevier Sci Pub Co, pp. 369–374.
Wilson, S. R. et al, "Rapid Isothermal Anneal of $^{75}$As Implanted Silicon" in *Appl. Phys. Lett.*, vol. 41, No. 10, 15 Nov. 1982, pp. 978–980.
Nishiyama, K. et al., "Radiation Annealing of Boron-Implanted Silicon With a Halogen Lamp" in *Japanese J. Applied Physics* 19(10), 10–1980, pp. L563–L566.
Usami, A., et al., "Flash-Lamp Annealing of Ion-Implanted Silicon and Its Application to Solar Cells" in *IEEE Electron Device Letters*, vol-Ed 4, No. 6, 6–1983, pp. 166–168.
Schroen, W. H., "The Impact of Process Control on Parameter Stability-A Review" in *Semiconductor Silicon*, edited by H. R. Huff et al, pp. 738–758.
Sansbury, J., "Application of Ion Implantation in Semiconductor Processing" in *Solid State Technology*, Nov. 1976, pp. 31–38.
Moline, R. A., et al., "Ion Implanted Hyperabrupt Junction Voltage Variable Capacitors" in *IEEE Trans on Electron Devices*, vol-Ed 19, No. 2, 2–1972, pp. 267–273.

*Primary Examiner*—Olik Chaudhuri
*Attorney, Agent, or Firm*—Robert M. Handy

[57] ABSTRACT

Zener diodes and other semiconductor junctions having very low noise characteristics and improved yield may be obtained by first ion implanting a suitable impurity into a substrate wafer, and then forming the p-n junction using a very rapid thermal activation and annealing process. For p-n junctions formed with boron ($^{11}$B) implanted into n-type silicon to a peak concentration exceeding $10^{20}$ atoms/cm$^3$, the rapid activation process comprises heating from about room temperature to about 1150° C. in 12–30 seconds, and then cooling back below 1000 degrees C. in less than 5 seconds. Noise voltages measured on devices formed using the invented process were typically much lower and more narrowly grouped than on devices of the prior art. Dynamic impedance was also slightly reduced.

4 Claims, 10 Drawing Figures

METHOD FOR PRODUCING LOW NOISE, HIGH GRADE CONSTANT SEMICONDUCTOR JUNCTIONS

BACKGROUND OF THE INVENTION

1. Field of the Invention

This invention relates in general to means and methods for low noise semiconductor junctions and devices and, more particularly, to improved means and methods for low noise zener diodes having improved characteristics.

2. Background Art

Voltage reference diodes are well known in the semiconductor art. These devices are designed to go into non-destructive Zener or avalanche breakdown at particular voltages, typically from about 1.8 volts to more than 200 volts. As used herein, the term "Zener" or "Zener diode" is intended to encompass all such voltage reference behavior or devices, irrespective of the particular breakdown mechanism which gives rise to the voltage reference behavior.

In general, Zener diodes consist of a p-n junction formed from two oppositely doped semiconductor regions having carefully controlled dopant concentration and distribution. For Zener diodes with minimum breakdown voltage, i.e. about 1.8 volts, the p and n regions must both be very highly doped, typically in the range $10^{19}$ to $10^{21}$ per $cm^3$, and the junction must be abrupt. This requires a very steep doping profile. In the prior art, alloying has been a preferred method of fabricating Zener diodes in the voltage range of 1.8 to about 10 volts.

The Zener voltage may be increased by reducing the doping, first on one side of the p-n junction, for voltages in the range 1.8 to about 10 volts, and then on both sides of the p-n junction for voltages approximately in the range 10 to 200 volts. Diffusion has been a preferred method for fabricating Zener diodes which operate in the range of about 10 to 200 volts. Diodes having voltages around 10 volts may be fabricated by either method.

Despite great effort at process control there is still considerable variation in the properties of Zener diodes which nominally have received identical processing. For example, the manufacturing process produces a distribution of Zener voltages, dynamic impedances, and noise output rather than a single Zener voltage, dynamic impedance, and noise output. As a consequence, the manufactured product must be sorted to obtain the particular voltage, dynamic impedance, and noise characteristics desired. This is less economical since the distribution of manufacturing output does not in general match the distribution of market demand. To obtain an adequate supply of a particularly popular set of Zener characteristics, other devices having less popular Zener characteristics must inevitably be manufactured. Sometimes these must be discarded. Accordingly, there is a continuing need for improved means and methods for Zener diodes having more predictable, controllable, and repeatable manufacturing yield to a desired target specification.

A particular problem with prior art devices is the noise figure. Zener diodes generate electrical noise which limits their usefulness in many circuit applications. This noise is believed to arise from, among other things, minute fluctuations in the breakdown process. Some noise is inevitable in all devices, but the typical noise levels of prior art Zener diodes has been higher than has been desired. While some prior art Zener diodes can exhibit relatively low noise, just as some prior art diodes can have Zener voltages in a particular range, there has not existed in the prior art a method for manufacturing a high yield of Zener diodes with consistent and uniform low noise characteristics.

Accordingly, it is an object of the present invention to provide improved means and methods for Zener diodes having improved and closely grouped characteristics.

It is a further object of the present invention to provide improved means and methods for Zener diodes having lower noise than generally obtained with the prior art.

It is an additional object of the present invention to provide improved means and methods for Zener diodes having equal or lower dynamic impedance for a given Zener voltage than generally obtained with the prior art.

It is a still further object of the present invention to provide improved means and methods for Zener diodes wherein a greater proportion of the manufacturing output has lower noise and/or dynamic impedance than obtainable with the prior art.

It is an additional object of the present invention to provide improved means and methods for Zener diodes wherein the above objectives are obtained simultaneously.

SUMMARY OF THE INVENTION

These and other objects and advantages are achieved through the present invention wherein there is provided an improved process for the manufacture of low noise semiconductor junctions, especially for the manufacture of low noise Zener diodes having well controlled and repeatable characteristics, comprising: providing a semiconductor substrate; implanting impurity atoms in the substrate to a predetermined dose and depth, very rapidly heating the ion implanted substrate to an elevated temperature sufficient to activate the ion implanted impurity atoms and anneal implantation damage while avoiding a decrease in the grade constant of the implanted impurity atoms at the junction; and thereafter rapidly cooling the ion implanted substrate to stop significant further diffusion of the impurity atoms.

In a preferred embodiment, the heating and cooling steps are performed by rapidly heating and cooling the ion implanted substrate to a peak activation temperature exceeding 1000° C. For boron ion implanted in silicon, the substrate temperature is raised from room temperature to above about 1000° C. in less than thirty seconds, reaching, for example, a peak temperature of about 1150° C. The ion implanted substrate is thereafter rapidly cooled below 1000° C. to avoid reduction of the grade constant by continued diffusion of the impurity atoms. It is preferred to cool to below 1000° C. in less than five seconds. Zener junctions having lower noise and equal or lower dynamic impedance are thereby obtained.

DETAILED DESCRIPTION OF THE FIGURES

Figure 1:
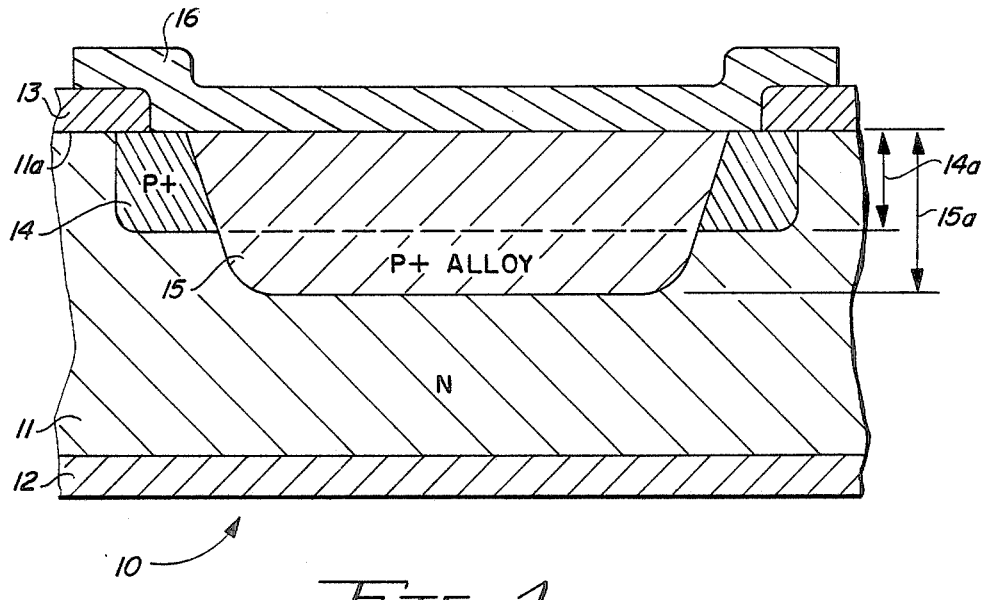
FIG. 1 shows, in schematic form, a cross-section of an alloy Zener diode, formed according to the prior art.

FIG. 1 shows a schematic cross-section of prior art Zener diode 10 consisting of substrate 11 with upper surface 11a, substrate electrode 12, dielectric layer 13 on upper surface 11a, diffused region 14, alloyed region 15 penetrating through diffused region 14 into substrate 11, and top surface contact 16. Diffused region 14 has depth 14a, and alloy region 15 has depth 15a greater than depth 14a. In a typical structure, substrate 11 is N-type silicon, diffused region 14 is heavily doped P-type, and alloyed region 15 is strongly P-type. Aluminum is a convenient material for forming alloyed region 15, boron is a convenient impurity for doping diffused region 14, silicon dioxide is used for dielectric layer 13, and metal layer 16 is conveniently Ti-Ni-Ag or other metals. Substrate electrode 12 may also be of Ti-Ni-Ag or other metals. Devices having Zener voltages in the range 1.8 to about 10 volts are readily constructed in this way. To construct higher voltage devices, region 15 is omitted and the p-n junction is formed between substrate 11 and diffused region 14.

Figure 2:
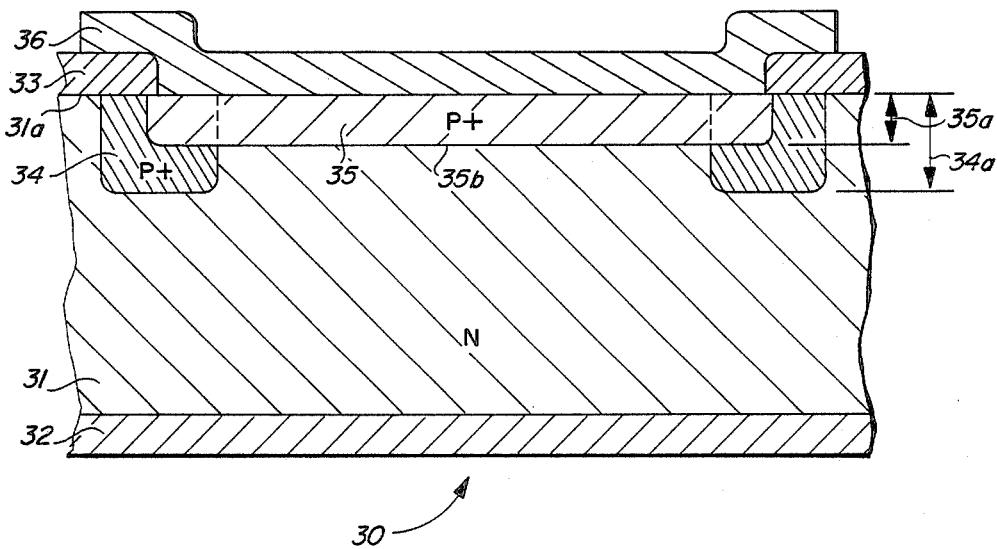
FIG. 2 shows, in schematic form, a cross-section of an ion implanted-rapid activated Zener diode according to the present invention.

FIG. 2 shows, in schematic form, a cross-section of comparable Zener diode 30, formed according to the present invention. Diode 30 comprises substrate 31 having upper surface 31a and lower electrode 32. Upper surface 31a has thereon dielectric layer 33 and upper electrode 36. Where substrate 30 is of silicon, silicon dioxide or silicon nitride are useful for dielectric 33, and Ti-Ni-Ag is useful for upper electrode 36 and lower electrode 32, although other materials may also be used. Doped region 34, which is generally diffused, penetrates into substrate 31 from surface 31a. Doped region 34 is generally referred to as a guard ring. Region 34 is generally circular or rectangular with rounded corners, although this is not essential. Region 34 may be of any closed annular shape.

Ion implanted and activated doped region 35 lies laterally within doped region 34 and is in contact with upper electrode 36. Depth 35a of ion implanted and activated doped region 35 is less than depth 34a of doped region 34. Doped region 34 insures that breakdown occurs at central p-n junction interface 35b between doped region 35 and substrate 31 rather than at the periphery of region 35 near where region 35 intersects surface 31a. Central p-n junction interface 35b is located laterally within annular doped region 34.

Figure 3A:
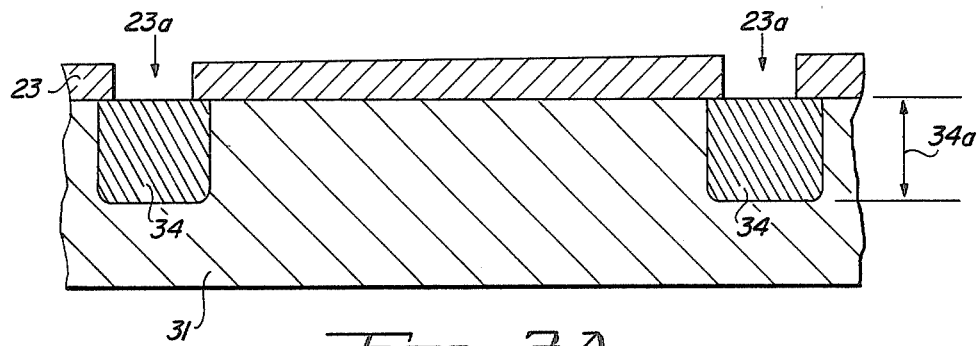
FIGS. 3A-D show, in schematic form, successive cross-sections of an ion implanted-rapid activated Zener diode of the present invention at different stages of manufacture.
Figure 3B:
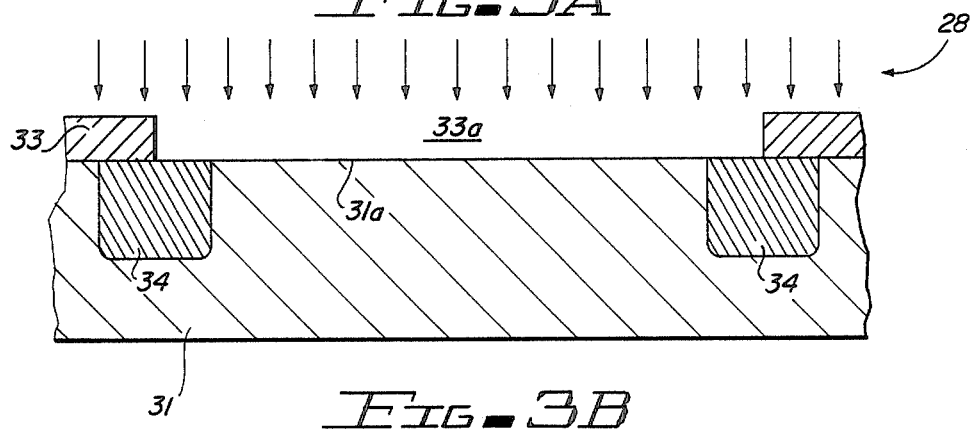

FIGS. 3A-D illustrate a preferred method of forming the semiconductor junction illustated in FIG. 2. In FIG. 3A, substrate 31 has located thereon conventional masking layer 23 having opening 23a, through which doped region 34 is formed, typically by diffusion. Mask 23 is then replaced by dielectric layer and mask 33 having opening 33a whose perimeter lies above doped region 34 (see FIG. 3B). Layer 33 is typically of silicon oxide and/or nitride. Ions 28, indicated by arrows, are directed at surface 31a of substrate 31 using conventional ion implantation means. Where substrate 31 is N-type, boron is a convenient P-type dopant which may be ion implanted by means well known in the art. Impurity ions 28 are implanted in substate 31 in region 25 to a predetermined dose whose value depends on the desired Zener characteristics. In a typical example, a substrate of N-type silicon of 0.067 ohm-cm resistivity, boron $^{11}$B was ion implanted at 80 keV to a dose of about $1 \times 10^{16}/cm^2$ at a temperature of about 100° C. or less. Under these conditions, the implanted boron has its peak concentration about 0.28 microns below surface 31a. The implanted boron concentration falls to a level equal to the impurity concentration of the background substrate (e.g. $2 \times 10^{17}/cm^3$ N-type) at about 0.65 microns, as indicated by dashed line 25b at depth 25a.

Figure 3C:
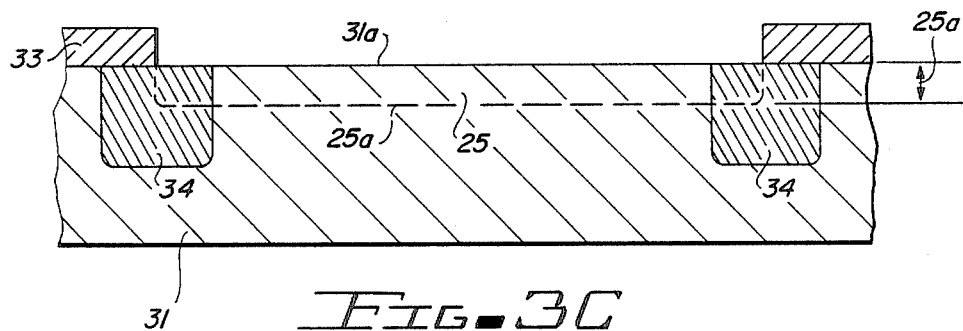
Figure 3D:
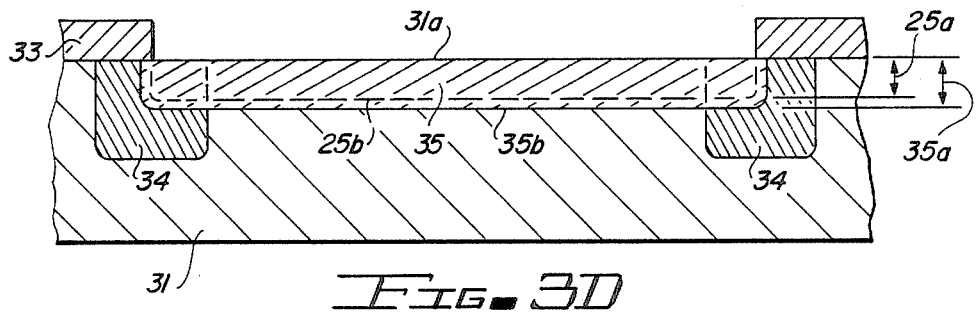

When impurity ions 28 penetrate into substrate 31 in region 25 as depicted in FIG. 3C, they are neutralized to form impurity atoms. When the implant is carried out at low temperature, few of these implanted impurity atoms in region 25 are electrically active. In addition, there is a substantial amount of implant damage, that is, damage to the otherwise nearly perfect crystalline lattice of substrate 31 caused by the impact of energetic ions 28. It is well known in the art that the as-implanted device must be heated to activate the implanted impurity and anneal the implant damage. The activation process is believed to allow the implanted atoms to move from largely random locations into substitutional locations in the crystalline lattice of the substrate. The result is illustrated schematically in FIG. 3D wherein active implanted region 35 of depth 35a is formed from inactive implanted region 25 of depth 25a as a result of the activation heating process. As used herein, the words "activate" or "activation" are intended to include annealing of ion implant damage and/or rendering the implanted atoms electrically active so that they may function as donors or acceptors. It is believed that both processes occur at substantially the same time.

It has been discovered that the characteristics of semiconductor junctions, particularly Zener diodes are affected by the speed with which the activation process is carried out. In particular, it has been discovered that Zener diodes of superior characteristics are obtained if the activation process is carried out in extremely short times, of the order of a few tens of seconds to a few seconds or less. This has not been previously known or recognized. As used herein the words "rapid activation" refer to devices or processes where the activation heating is carried out in a few tens of seconds or less.

It is believed that the superior characteristics which are obtained with the method of the present invention, come about because the ion implanted impurity distribution changes in a previously unanticipated way when very rapid activation is used. In particular, an extremely large grade constant is obtained. The grade constant is the slope of the implanted impurity concentration at the junction, i.e. at the point where the implanted concentration equals the background concentration.

It has been observed that the grade constant is not lowered by the rapid activation process, even though the implanted impurities diffuse deeper into the substrate. The grade constant appears to increase. This is an unexpected result and is contrary to the conventional wisdom, that the grade constant inevitably decreases as the implanted impurities diffuse deeper into the substrate during post implant heating. The very low noise performance and improved dynamic impedance obtained as a result of the invented method are also unexpected, since such performance has not, so far as is known, been observed, suggested, or predicted in the prior art to occur as a consequence of the invented fabrication method, based on either reported experimental results or theoretical analysis.

Figure 4:
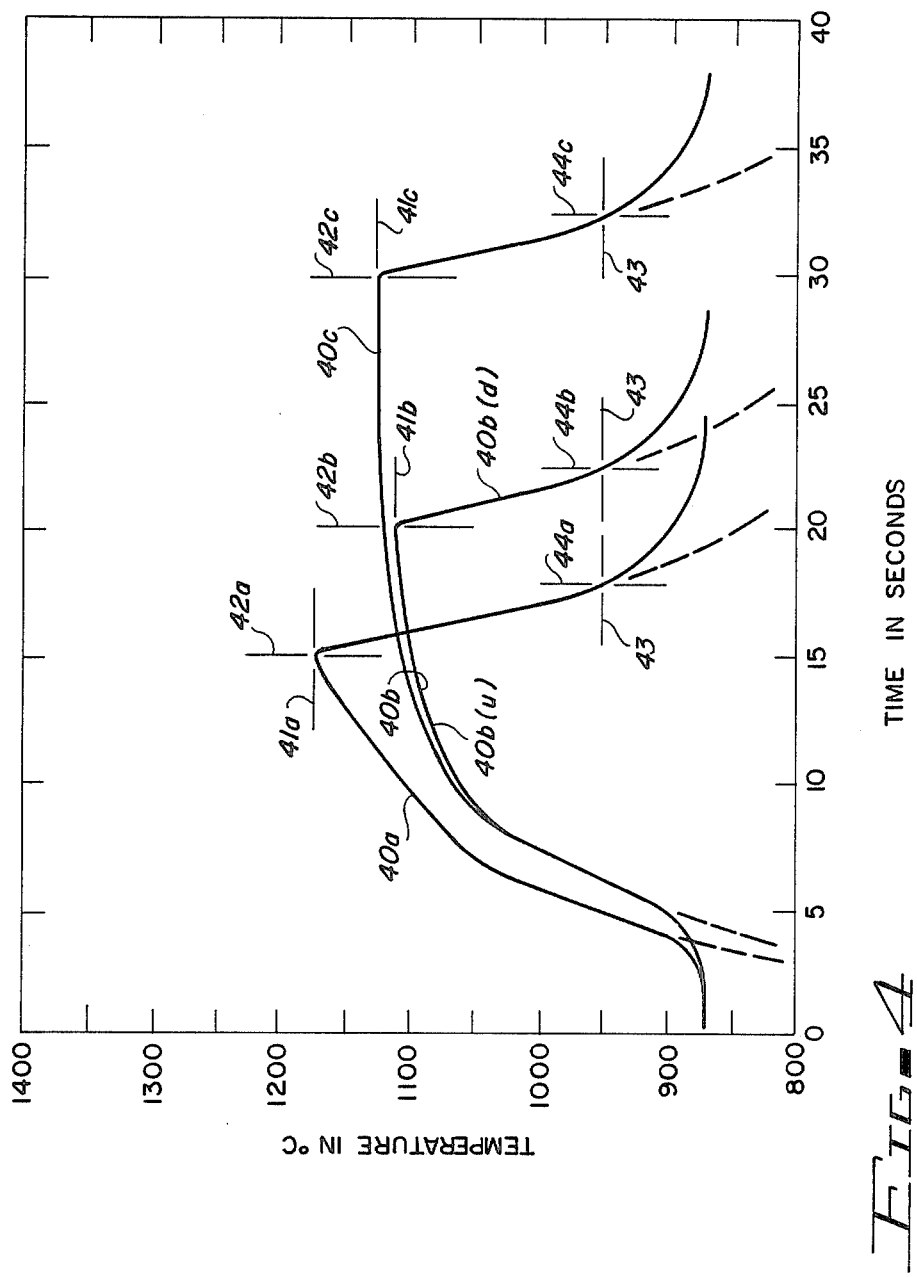
FIG. 4 shows temperature-time profiles for rapid activation of Zener diodes or other semiconductor junctions according to the present invention.

FIG. 4 shows, a typical temperature-time profile 40 for rapid activation of semiconductor junctions, particularly Zener diodes, according to the method of the present invention, and for a particular semiconductor-dopant combination. The times and temperatures of FIG. 4 are for rapid activation of boron ($^{11}$B) in silicon. Boron has a diffusivity in silicon in the range 0.08 to 1.5 microns squared per hour for temperatures between 1000 and 1300 degrees centigrade. Based on the teachings herein, those of skill in the art will understand how to construct temperature-time profile for other choices of semiconductors and/or other dopants.

EXAMPLES

The following are examples of the practice of the method of the present invention for several different conditions.

The ion implanted substrate, which generally is a semiconductor wafer, is initially about at room temperature. A rapid heating apparatus, such as for example, a model IA-200 Rapid Isothermal Annealing apparatus, manufactured by Varian-Extrion of Gloucester, Massachusetts, is used to rapidly heat and cool the wafer. Other commercially available systems could also be used. In the IA-200 apparatus, heating is typically accomplished by placing the substrate in an evacuated chamber, such that the substrate is, to a first approximation, only radiatively coupled to its surroundings. The substrate is surrounded by a chamber which is at a low temperature, typically about room temperature. The ion implanted surface of the substrate faces a moveable shutter. Behind the shutter is a radiant heat source, generally of the same or larger area than the substrate and whose temperature is equal to or higher than the desired activation temperature. The temperature of the heat source is referred to as the target temperature. The duration of the heat pulse supplied to the wafer is controlled by opening and closing the shutter.

Other types of apparatus use somewhat different methods for achieving rapid isothermal heating. For example, a powerful flash lamp is frequently used. The duration and/or intensity of the flash are varied in order to rapidly couple energy to the wafer so that it can be rapidly heated and cooled in an equivalent way. In this type of apparatus an evacuated chamber is not required. In the description which follows, the procedures corresponding to the IA-200 type apparatus are described. Those of skill in the art will understand that this is merely exemplary and that equivalent temperature-time profiles can be readily achieved using other commercially available apparatus.

Profiles 40a-c of FIG. 4 illustrate wafer temperature-time profiles for three different target temperatures and heater exposure times. The target temperature of profile 40a was 1200° C., of profile 40b 1150° C. and profile 40c 1150° C. The temperature shown in FIG. 4 is measured by an optical pyrometer looking at the rear face of the substrate, that is, the surface of the substrate which faces away from the shutter and the heater. The pyrometer in these tests was not capable of reading temperature below about 875° C. Hence observed temperature profiles 40a-c, corresponding to the solid lines in FIG. 4, start from about 875° C., even though the actual wafer temperatures, as indicated by the dashed lines in FIG. 4, rise from about room temperature.

The shutter of the IA-200 apparatus is quickly opened so that the ion implanted surface of the substrate is suddenly exposed to the radiant heat source. The opening of the shutter corresponds to time t=0 in FIG. 4. For a flash lamp type system, t=0 would correspond to initiation of the flash. The thermal mass of the wafer shaped substrate is generally very small and the substrate is conductively isolated from its surroundings. Hence, the temperature of the substrate rises very rapidly toward the temperature of the radiant heat source. Within about 4 seconds, the substrate temperature rises above the minimum temperature ($\sim$875° C.) measureable by the pyrometer.

Consider, for example temperature-time profile 40b which has a target temperature of 1150° C. The temperature of substrate 31 is raised to activation temperature 41b during time period 42b, as is indicated by portion 40b(u) of temperature-time curve 40b. Time period 42b runs from time zero until the substrate temperature reaches predetermined activation temperature 41b. Using a 100 mm diameter, 20 mil (0.5 mm) thick, silicon wafers as substrate 31, it was found that substrate 31 could be heated from about room temperature to activation temperatures in the range 1050° to 1200° C. in time periods as short as about 8 seconds. The higher the target temperature, the more rapidly a given peak temperature is achieved. This can be seen by comparing temperature-time profiles 40a and 40b.

At time 42b the shutter of the IA-200 apparatus is quickly closed so that substrate 31 is no longer exposed to the heater. In a flash lamp system, the flash would be quenched or cut off at time 42b. As used herein, the words "open shutter time" refer generally to the time period from time t=0 until the time when the shutter is closed or the flash lamp extinguished, so that heat input to the wafer is cut off, as for example at time 42b of curve 40b.

When the heat input is cut off at time 42b on curve 40b, wafer substrate 31 has reached activation temperature 41b. With the shutter closed the substrate is once again surrounded by a low temperature environment and the temperature of substrate 31 now drops rapidly, as shown by portion 40b(d) of temperature-time curve 40b. The rapid drop in temperature occurs because substrate 31 has little thermal mass and a large radiating surface. The substrate temperature drops below 950° C. by about 2 seconds after the radiant energy input is terminated, e.g. by closing the shutter or cutting-off the flash lamp. Below about 950° C., the pyrometer no longer accurately measures the temperature or rate of change of temperature. The actual substrate temperature continues to drop toward room temperature as shown schematically by the dashed lines.

It is not necessary that the temperature of substrate 31 drop completely to room temperature. The rate of redistribution of the impurity atoms slows to a negligible rate, as compared to the rate of change of temperature, at some critical temperature 43. It is important that the cooling rate be sufficiently rapid so that the implanted impurity atoms no longer move significantly after the rapid activation. Otherwise, redistribution due to normal diffusion will decrease the grade constant. Accordingly, it is important that the temperature of substrate 31 fall quickly below critical temperature 43 at times 44a–c. For boron in silicon, critical temperature 43 is in the range of 900°–1000° C. It can be seen from temperature profiles 40a–c, that times 44a–c corresponding to critical temperature 43 can be achieved within 2–3 seconds of heater cut-off times 42a–c. It is desirable that the substrate temperature fall below 900°–1000° C. in less than about 5 seconds, preferably within 2–3 seconds. Substrate 31 may be removed from the system without adverse effect any time after the temperature is below the temperature at which significant oxidation of substrate 31 can occur. This latter temperature is about 500 degrees C. for silicon.

Figure 5:
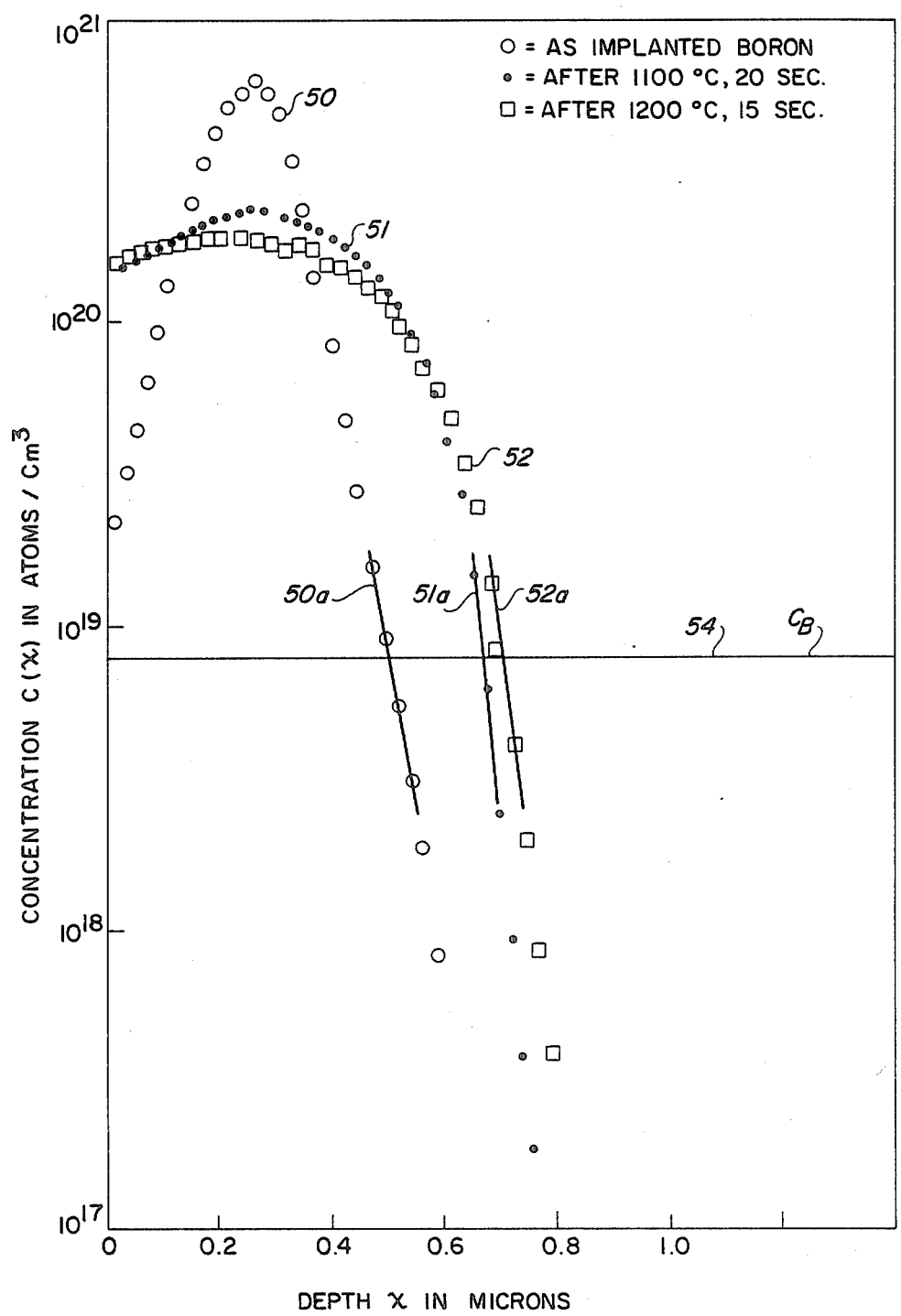
FIG. 5 shows concentration versus depth for boron in silicon for the as-implanted profile and for the profile after rapid activation according to the method of this invention.

FIG. 5 shows plots of concentration in atoms per $cm^3$ versus depth in microns for 80 keV $^{11}B$ ions implanted to a dose of $1 \times 10^{16}$ ions/$cm^2$ in $8 \times 10^{18}$/$cm^3$ N-doped silicon. Curve 50 is the as-implanted concentration profile measured using Secondary Ion Mass Spectroscopy (SIMS). Curves 51 and 52 are the concentration profiles determined after rapid activation heating steps, such as were described in connection with FIG. 4. Curve 51 corresponds to rapid activation for 20 seconds open shutter time with a heater target temperature of 1100° C. Curve 52 corresponds to activation for 15 seconds open shutter time with a heater target temperature of 1200° C. Curves 51 and 52 were determined using SIMS. SIMS techniques are well known in the art. Line 54 shows the background doping density of the N-type substrate, which for these samples was about $8 \times 10^{18}$/$cm^3$.

The grade constant "a" is given by $$a = -d \, [C(x)]/dx \text{ at } x = X_j$$

where $C(x)$ is the concentration, x is the distance from the surface, and $X_j$ is the depth at which $C(x)$ equals the background concentration $C_B$.

It can be shown that where $C(x)$ is plotted as in FIG. 5, the grade constant is given by $a = -2.3 \, m \, C_B$, where m is the slope of the tangent to the concentration profile at the substrate concentration $C_B$. Tangent lines 50a, 51a, and 52a are indicated for concentration profiles 50, 51, and 52 respectively.

As is expected from conventional diffusion theory, the peak concentrations of activated profiles 51 and 52 of FIG. 5 are lower than the peak concentration of as-implanted profile 50. As is also expected from conventional theory, the implanted impurities have spread out, diffusing almost 0.2 microns deeper into the substrate.

Normally one expects the slope of the impurity profile to decrease as well. Unexpectedly, this was not observed. It is apparent from FIG. 5 that tangent lines 51a and 52a have a greater slopes than tangent line 50a. The difference is at least 50 percent. The grade constant after rapid activation heating is greater than the grade constant of the as-implanted profile. It was further determined that the increase in grade constant depends on the initial implant dose, the higher the implant dose the more likely that an increase in grade constant will be obtained and the larger the increase. If the implant dose is small the grade constant may not increase. It is desirable that the peak implant concentration exceed about $10^{20}$ atoms/$cm^3$. The large grade constant which can be obtained with the invented process is very advantageous for constructing Zener diodes of superior properties.

Figure 6A:
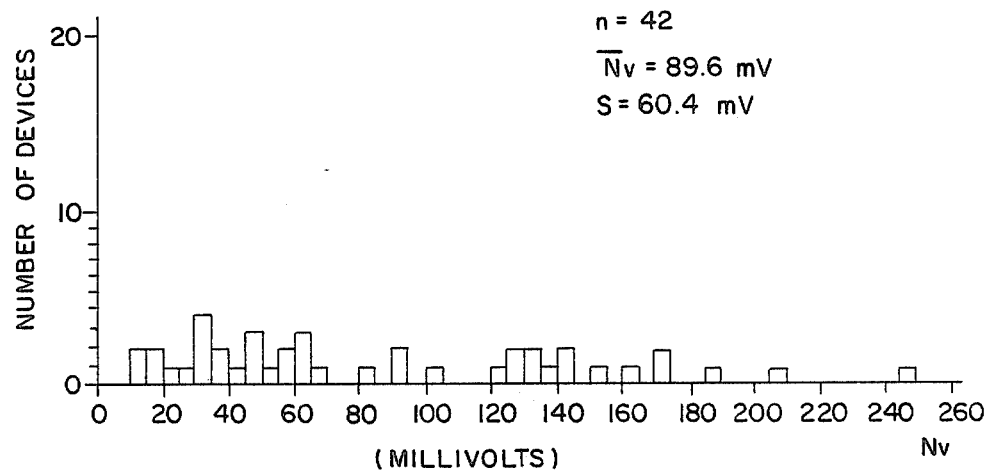
FIGS. 6A-B show histograms of the number of Zener diodes in a manufacturing lot having particular noise voltages, for devices manufactured according to the prior art and devices manufactured according to the present invention, respectively.
Figure 6B:
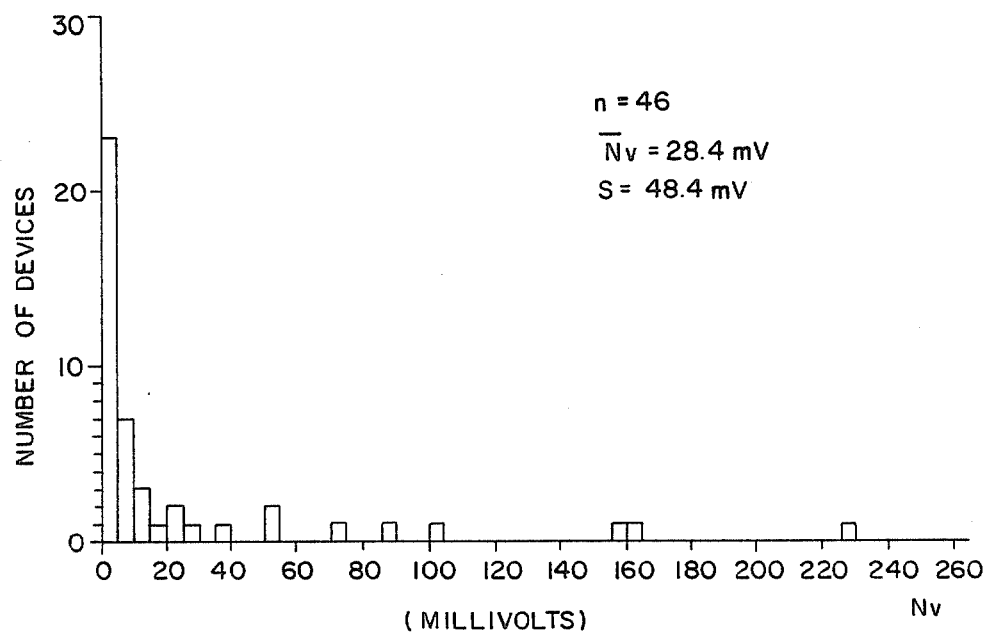

It has been discovered that very low noise junctions are obtained when rapid activated ion implanted impurity atoms are used to form the junction. FIGS. 6A–B show representative histograms of the number of Zener diodes in a manufacturing lot having a particular noise voltage. FIG. 6A is for devices prepared according to the prior art, and FIG. 6B is for devices prepared according to the present invention. The data of FIG. 6A were taken from devices produced by diffusion. The data of FIG. 6B were obtained using boron ($^{11}B$) implanted in silicon at 80 keV at about $1 \times 10^{16}$ ions/$cm^2$, and rapid activated with a target temperature of 1200° C. for about 15 seconds open shutter time. Both sets of devices had substantially the same Zener voltage (about 12 volts) and were drawn from their respective manufacturing lots according to the same procedure, so as to produce what is believed to be an unbiased sample. They were tested in the same way using techniques well known in the art.

The noise voltage $N_v$ was measured at a conduction current of 250 micro-amperes using a pre-amplifier having a gain of 100, a 2000 Hz bandwidth bandpass filter centered at 2000 Hz, and a true RMS voltmeter calibrated in millivolts. The noise density $N_d$ is usually expressed in microvolts per square-root bandwidth in cycles. To convert the measured noise voltage $N_v$, as shown on the abcissa of FIGS. 6A–B, to the noise density $N_d$, expressed in microvolts per square-root bandwidth in cycles, one multiplies the value of $N_v$ in volts by $1/[100 \times (2000)^{\frac{1}{2}}] = 2.24 \times 10^{-4}$. The numbers of samples (n), the means ($\overline{N_v}$), and the sample standard deviations (S) of the data making up the histograms of FIGS. 6A–B are shown on the figures.

The histogram from the prior art device (FIG. 6A) shows a broad distribution of noise voltages, while the histogram from devices made according to the teachings of the present invention (FIG. 6B) shows a much narrower distribution of noise voltages, and overall much lower noise voltage values. The data are compared in the following table:

| COMPARISON OF NOISE OUTPUT | | | |
|---|---|---|---|
| | | Percentage of the Device Population At or Below the Indicated Noise Level | |
| Noise Voltage $N_v$ (mV) | Noise Density $N_d$ (μV/Cyc$^{\frac{1}{2}}$) | Prior Art Devices (%) | Invented Devices (%) |
| 5 | 1.1 | 0 | 50 |
| 10 | 2.2 | 0 | 65 |
| 20 | 4.5 | 10 | 74 |
| 40 | 8.9 | 29 | 83 |
| 60 | 13.4 | 45 | 87 |

It is evident that the present invention gives a much higher yield of devices having low noise voltages and a much narrower grouping of noise voltage values. Standard measurements of other Zener diode parameters from the same samples, showed that devices made according to the method of the present invention were comparable to or better than the devices made according to the prior art methods. Other things being equal, the dynamic impedance $Z_{Zk}$ measured at the knee of the Zener characteristic is generally slightly lower for devices made according to the invented method. Definition of $Z_{Zk}$ and other parameters commonly used for characterizing Zener diodes can be found in the Motorola Zener Diode Manual, published by Motorola Inc., Phoenix, Arizona, (1980).

Thus, it is apparent that there has been provided in accordance with this invention an improved means and method for low noise semiconductor junctions, especially Zener diode junctions. Further, there has been provided a means and method for Zener diodes having improved characteristics, wherein lower and more closely grouped values of noise voltage (or noise density) and dynamic impedance, and higher yield at low noise density and dynamic impedance are obtained than in the prior art, and without degradation of other device characteristics or yield.

While the invention has been described in terms of certain recommended materials, impurities, and device configurations, it will be understood by those of skill in the art that the invented means and method are useful with other substrate and impurity materials, other shapes, and other device configurations, where it is desired to obtain improved properties, especially low noise semiconductor junctions. Further, while the temperatures and times have been illustrated for boron in silicon, it will be apparent to those of skill in the art that the principles taught in the present invention of using very rapid activation of ion implanted impurities to obtain higher grade constants and low noise junctions is generally applicable to a wide variety of semiconductor substrate and dopant materials, and different activation apparatus, and that activation temperatures and times for other materials and apparatus can be determined using the teachings contained herein. Accordingly, it is intended to encompass all such variations as fall within the scope of the invention.

We claim:

1. A process for forming low noise semiconductor junctions comprising:
   providing a semiconductor substrate containing an impurity of a first conductivity type and a first concentration;
   implanting an impurity of a second type in said substrate to a dose about $1 \times 10^{16}$ ions/cm$^2$ or larger; and
   rapidly heating and cooling said substrate without melting to activate an increase the depth of penetration of said implanted impurity without decreasing the slope of the concentration profile of said implanted impruity in said substrate at said first concentration.

2. The process of claim 1 wherein said implanting step comprises implanting said impurity so that the peak of said implanted distribution lies less than 0.3 microns from the surface of said substrate.

3. The process of claim 14 wherein said rapidly heating and cooling step comprises rapidly heating and cooling said saubstrate so that the total time above 1000° C. is less than 40 seconds.

4. A process for forming low noise semiconductor junctions comprising:
   providing a semiconductor substrate containing an impurity of a first conductivity type and a first concentration;
   implanting an impurity of a second type in said substrate to a dose of $1 \times 10^{16}$ ions/cm$^2$ or larger; and
   rapidly heating and cooling said substrate without melting to a temperature exceeding 1000° C. for a time less than about 40 seconds.

* * * * *

UNITED STATES PATENT AND TRADEMARK OFFICE
CERTIFICATE OF CORRECTION

PATENT NO. : 4,732,866

DATED : March 22, 1988

INVENTOR(S) : Chruma et al.

It is certified that error appears in the above-identified patent and that said Letters Patent is hereby corrected as shown below:

Column 10, claim 1, line 11, change "an" to --and--.

Column 10, claim 1, line 14, change "impruity" to --impurity--.

Column 10, claim 3, line 20, change "14" to --1--.

Column 10, claim 3, line 22, change "saubstrate" to --substrate--

Signed and Sealed this

Thirtieth Day of August, 1988

Attest:

DONALD J. QUIGG

Attesting Officer

Commissioner of Patents and Trademarks